US009229565B2

(12) United States Patent
Shin

(10) Patent No.: US 9,229,565 B2
(45) Date of Patent: Jan. 5, 2016

(54) METHOD OF MANUFACTURING DISPLAY APPARATUS

(71) Applicant: Jae Deuk Shin, Yongin (KR)

(72) Inventor: Jae Deuk Shin, Yongin (KR)

(73) Assignee: SAMSUNG DISPLAY CO., LTD., Yongin, Gyunggi-do (KR)

( * ) Notice: Subject to any disclaimer, the term of this patent is extended or adjusted under 35 U.S.C. 154(b) by 190 days.

(21) Appl. No.: 13/942,875

(22) Filed: Jul. 16, 2013

(65) Prior Publication Data

US 2014/0130339 A1    May 15, 2014

(30) Foreign Application Priority Data

Nov. 14, 2012  (KR) .................. 10-2012-0129028

(51) Int. Cl.
| | |
|---|---|
| H05K 3/20 | (2006.01) |
| G06F 3/041 | (2006.01) |
| H01L 51/56 | (2006.01) |
| H01L 27/32 | (2006.01) |
| G02F 1/1333 | (2006.01) |
| H01L 51/52 | (2006.01) |

(52) U.S. Cl.
CPC ............ *G06F 3/0412* (2013.01); *H01L 27/323* (2013.01); *H01L 51/56* (2013.01); *G02F 1/13338* (2013.01); *G02F 2201/50* (2013.01); *G02F 2201/501* (2013.01); *G06F 2203/04103* (2013.01); *H01L 51/5256* (2013.01); *Y10T 29/49002* (2015.01)

(58) Field of Classification Search
CPC ............ G02F 1/13338; G02F 2201/50; G02F 2201/501; G06F 2203/04103; G06F 3/041; G06F 3/0412; G06F 3/147; H01L 27/323; H01L 51/5256; H01L 51/56; Y10T 29/49002; Y10T 29/49117; Y10T 29/49128
USPC ............ 29/592.1, 602.1, 831, 835, 846, 854, 29/871, 872, 873; 178/18.01, 18.03, 178/18.05; 345/173, 174; 349/149–152
See application file for complete search history.

(56) References Cited

U.S. PATENT DOCUMENTS

| | | | | |
|---|---|---|---|---|
| 5,869,791 | A  * | 2/1999 | Young ................. | 178/20.01 |
| 8,162,212 | B2 * | 4/2012 | Chung et al. ........... | 235/383 |
| 2005/0179849 | A1* | 8/2005 | Nomura et al. .......... | 349/149 |
| 2006/0115578 | A1 | 6/2006 | Brand et al. | |
| 2008/0180626 | A1* | 7/2008 | Lee et al. ............... | 349/151 |
| 2009/0256819 | A1* | 10/2009 | Jung ..................... | 345/174 |
| 2011/0212661 | A1* | 9/2011 | Lee et al. ............... | 445/24 |
| 2012/0295071 | A1 | 11/2012 | Sato et al. | |
| 2013/0001546 | A1* | 1/2013 | Kamada et al. ......... | 257/43 |

FOREIGN PATENT DOCUMENTS

| | | |
|---|---|---|
| KR | 10 2007-0083830 A | 8/2007 |
| KR | 10 2008-0091588 A | 10/2008 |
| KR | 10 2012-0098823 A | 9/2012 |

* cited by examiner

*Primary Examiner* — Paul D Kim

(74) *Attorney, Agent, or Firm* — Lee & Morse, P.C.

(57) ABSTRACT

A method of manufacturing a display apparatus includes providing a display panel including two substrates facing each other and a display device disposed between the two substrates; providing a touch screen panel attached onto an outer side surface of one of the two substrates; attaching a multilayer protection film including a plurality of films having acid resistance onto the touch screen panel; etching the other of the two substrates; and removing the multilayer protection film. The protection films have penetration holes, each of the protection films having a different average area of the penetration holes in a plan view.

12 Claims, 4 Drawing Sheets

METHOD OF MANUFACTURING DISPLAY APPARATUS

CROSS-REFERENCE TO RELATED APPLICATION

This U.S. non-provisional patent application claims priority under 35 U.S.C. §119 to Korean Patent Application No. 10-2012-0129028, filed on Nov. 14, 2012, and entitled: "METHOD OF MANUFACTURING DISPLAY APPARATUS," the entire contents of which are herein incorporated by reference in their entirety.

BACKGROUND

1. Field

Embodiments relate to a method of manufacturing a display apparatus.

2. Description of the Related Art

A display apparatus may include a display device, an upper substrate disposed on the display device, and a lower substrate facing the upper substrate while supporting the display device.

The display device emits an outputted image and is disposed between the upper and lower substrates. The display device, the upper substrate, and the lower substrate are called a display panel. The upper substrate is disposed on the display device and performs a function of protecting the display device. The upper substrate may include a touch screen panel. The lower substrate faces the upper substrate while supporting the display device.

SUMMARY

Embodiments are directed to a method of manufacturing a display apparatus, including providing a display panel including two substrates facing each other and a display device disposed between the two substrates, providing a touch screen panel attached onto an outer side surface of one of the two substrates, attaching a multilayer protection film including a plurality of protection films having acid resistance onto the touch screen panel, etching the other of the two substrates, and removing the multilayer protection film. The protection films have penetration holes, each of the protection films having a different average area of the penetration holes in a plan view.

The average area of the penetration holes of respective ones of the protection films in a plan view may increase in accordance with a distance of the respective ones of the protection films from the touch screen panel.

A thickness of each of the protection films may decrease in accordance with an increase in the average areas of the penetration holes of the protection films.

The etching process may include a wet etching process using an etchant.

The average area of penetration holes of each of the protection films may be equal to or smaller than a size of molecules in the etchant.

The multilayer protection film may include a first protection film disposed on the touch screen panel and exposed to the outside when the etching process is performed, and a second protection film disposed between the first protection film and the touch screen panel.

The average area of penetration holes of the first protection film may be greater than the average area of penetration holes of the second protection film in a plan view.

A thickness of the second protection film may be greater than a thickness of the first protection film.

The multilayer protection film may include a first protection film disposed on the touch screen panel and exposed to the outside when the etching process is performed, a second protection film disposed between the first protection film and the touch screen panel, and a third protection film disposed between the second protection film and the touch screen panel.

An average area of penetration holes of the first protection film may be greater than an average area of penetration holes of the second protection film. The average area of penetration holes of the second protection film may be greater than an average area of penetration holes of the third protection film.

A thickness of the third protection film may be greater than a thickness of the second protection film. The thickness of the second protection film may be greater than a thickness of the first protection film.

BRIEF DESCRIPTION OF THE FIGURES

Features will become apparent to those of ordinary skill in the art by describing in detail exemplary embodiments with reference to the attached drawings in which.

DETAILED DESCRIPTION

Figure 1:
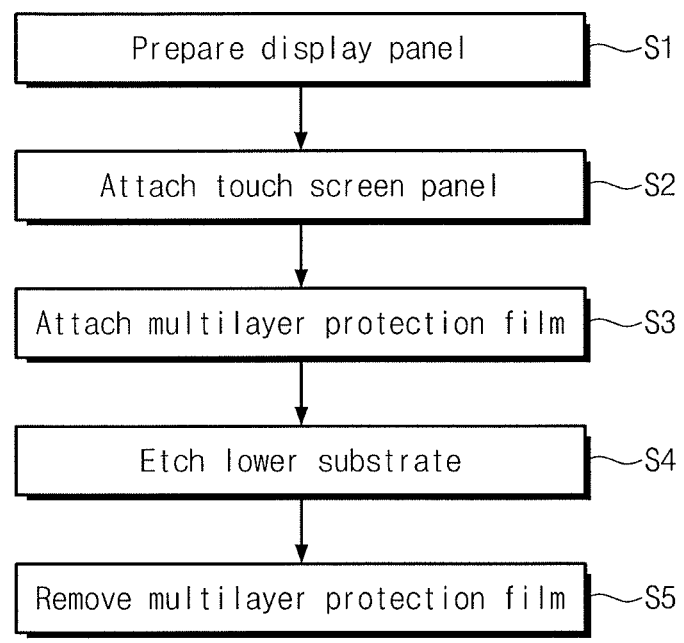
FIG. 1 is a flow chart illustrating a method of manufacturing a display apparatus in accordance with one embodiment.

Embodiments will be described more fully hereinafter with reference to the accompanying drawings, in which embodiments are shown. However, these may be embodied in many different forms and should not be construed as limited to the embodiments set forth herein. Rather, these embodiments are provided so that this disclosure will be thorough and complete, and will fully convey the scope thereof to those skilled in the art. In the drawings, the size and relative sizes of layers and regions may be exaggerated for clarity. Like numbers refer to like elements throughout.

The meaning of 'comprise', 'include', or 'have' specifies a property, a region, a fixed number, a step, a process, an element, and/or a component but does not exclude other properties, regions, fixed numbers, steps, processes, elements, and/or components. In the specification, it will be understood that when a layer (or film), a region, or a plate is referred to as being 'on' another layer, region, or plate, it can be directly on the other layer, region, or plate, or intervening layers, regions, or plates may also be present. In the specification, it will be understood that when a layer (or film), a region, or a plate is referred to as being 'under' another layer, region, or plate, it can be directly under the other layer, region, or plate, or intervening layers, regions, or plates may also be present.

Figure 2A:
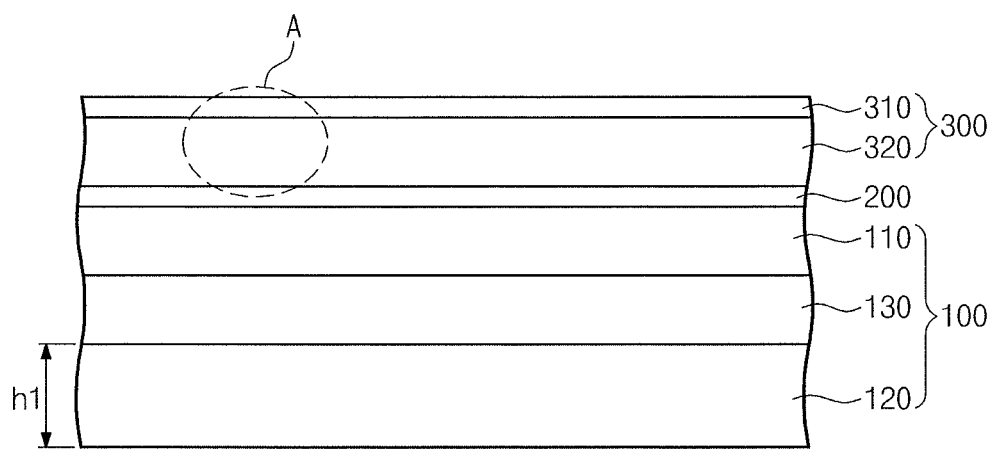
FIGS. 2A, 3, and 4 are process cross sectional views illustrating stages of a method of manufacturing a display apparatus in accordance with one embodiment.
Figure 2B:
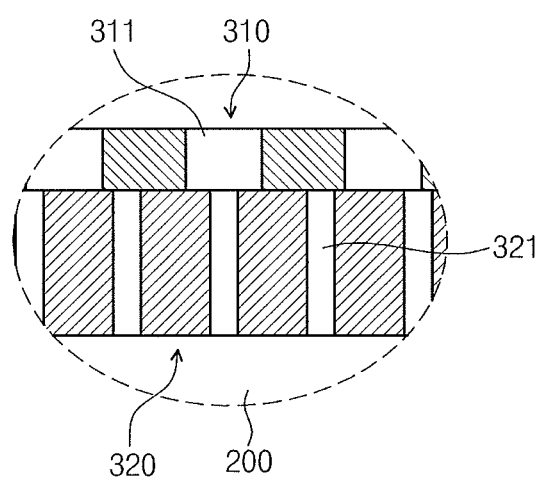
FIG. 2B is an enlarged view of area A illustrated in FIG. 2A.
Figure 3:
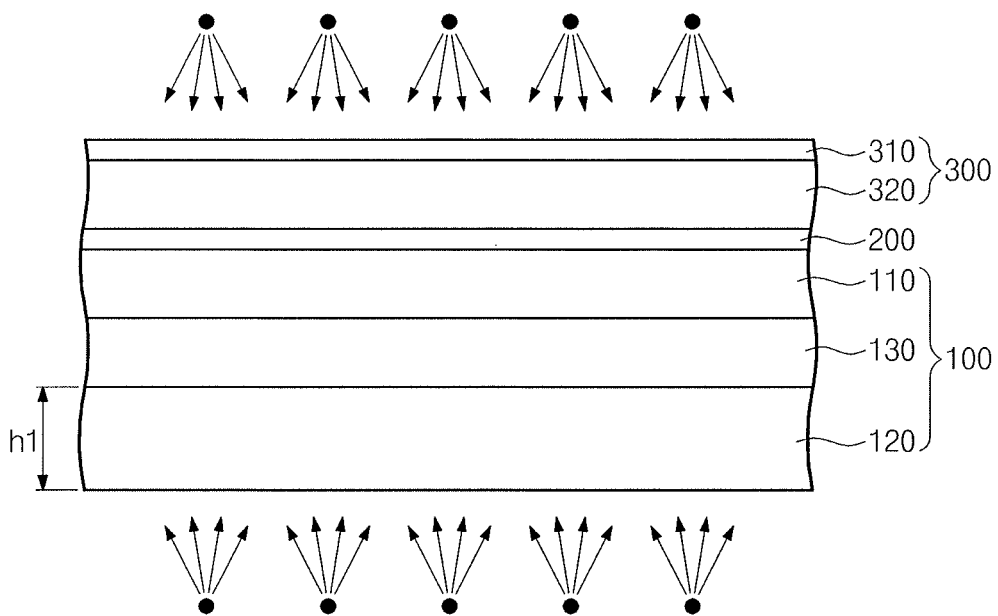
Figure 4:
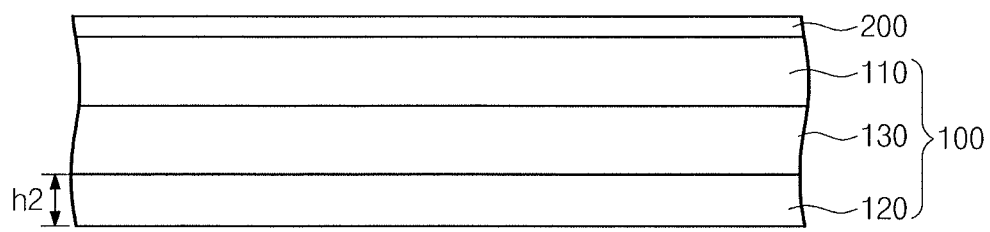

FIG. 1 is a flow chart illustrating stages of method of manufacturing a display apparatus in accordance with one embodiment. FIGS. 2A, 3, and 4 are process cross sectional views illustrating the stages of the method of manufacturing a display apparatus in accordance with the embodiment. FIG. 2B is an enlarged view of area A illustrated in FIG. 2A.

Referring to FIG. 1, the method of manufacturing a display apparatus in accordance with one embodiment includes preparing or providing a display panel (S1), attaching a touch screen panel (S2), attaching a multilayer protection film (S3), etching a lower substrate (S4), and removing the multilayer protection film (S5).

The method of manufacturing a display apparatus will be described in detail with reference to FIGS. 2A, 2B, 3, and 4.

First, in preparing or providing the display panel S1, a display panel 100 that can display an image is manufactured or obtained.

A spontaneous emission display panel such as an organic light emitting display panel may be used as the display panel 100. A non-emissive display panel such as a liquid crystal display panel, an electrowetting display panel, an electrophoretic display panel, or a microelectromechanical system display panel may be used as the display panel 100. In the present embodiment, the organic light emitting display panel is described as an illustration.

The organic light emitting display panel is a self-emission display panel.

Accordingly a viewing angle and contrast may be superior as compared with the liquid crystal display panel. Also, the organic light emitting display panel does not need a backlight. Accordingly, the organic light emitting display panel may be lightweight and thin, and may be advantageous with respect to power consumption, as compared with the liquid crystal display panel.

The organic light emitting display panel has a structure that an organic light emitting device 130 is disposed between two substrates 110 and 120 facing each other.

The organic light emitting display panel includes the organic light emitting device 130 disposed on a lower substrate 120, and an upper substrate 110 bonded to the lower substrate 120 by a sealing material (not shown) while protecting the organic light emitting device 130. The lower substrate 120 includes a thin film transistor array (not shown).

The organic light emitting device 130 includes an anode electrode (not shown), an organic film (not shown), and a cathode electrode (not shown) which are stacked on the lower substrate 120 in order. The organic film may include a hole injection layer (HIL) injecting a hole, a hole transport layer (HTL) which smoothly transports the hole and suppresses the movement of electrons that are not combined in a light emitting layer EML to increase a recombination chance of the hole and the electron, the light emitting layer EML emitting light by recombination of the electron and the hole that are injected, a hole blocking layer (HBL) for blocking the movement of holes that are not combined in the light emitting layer EML, an electron transport layer (ETL) for smoothly transporting the electron to the light emitting layer EML, and an electron injection layer (EIL) injecting the electron.

A direction from the lower substrate 120 toward the upper substrate 110 may be referred to as a front side direction and a direction from the upper substrate 110 toward the lower substrate 120 may be referred to as a back side direction. If the display panel 100 is a front side light emitting type that light generated from the organic film is output in the front side direction, the cathode electrode may have a semitransparent property and the anode electrode may have a light reflection property. If the display panel 100 is a back side light emitting type that light generated from the organic film is output in the back side direction, the cathode electrode may have a light reflection property and the anode electrode may have a semitransparent property.

In attaching a touch screen panel 200 (S2), the touch screen panel 200 is attached onto an outer side surface of one of the two substrates of the display panel 100. For instance, the touch screen panel 200 may be attached onto the upper substrate 110.

The touch screen panel 200 is an apparatus of inputting information by touching the screen panel with a finger or a pen. Examples of the touch screen panel 200 include a resistive method, a capacitive method, and an infrared method according to methods of sensing touch event of the touch screen panel 200.

The resistive method drives the screen panel using a touch being generated between electrodes by putting pressure on the screen panel. The capacitive method drives the screen panel using a change of capacitance being generated by touching the screen panel with a finger.

The touch screen panel 200 may be attached onto the upper substrate 110 using an optically clear adhesive.

In attaching a multilayer protection film 300 (S3), as illustrated in FIG. 2A, a multilayer protection film 300 including a plurality of protection films 310 and 320 having acid resistance is attached on the touch screen panel 200.

The multilayer protection film 300 is attached onto an entire surface of the upper substrate 110 including the touch screen panel 200.

As illustrated in FIG. 2B, the multilayer protection film 300 includes a first protection film 310 and a second protection film 320. The first protection film 310 is disposed on the touch screen panel 200 and is exposed to the outside when an etching process which will be discussed below is performed. The second protection film 320 is disposed between the first protection film 310 and the touch screen panel 200. That is, the second protection film 320 is attached onto the touch screen panel 200.

The first protection film 310 and the second protection film 320 may be formed of an acid resistance material (e.g., an organic highly polymerized film) that does not react to an etchant, as will be described below. As the organic highly polymerized film, a polyolefin polymer, for example, polyethylene, polypropylene, polybutadiene, polyvinyl chloride, polystyrene, or a copolymer including them may be used.

The first protection film 310 includes a plurality of penetration holes 311, and the second protection film 320 includes a plurality of penetration holes 312. In a plan view, average areas of the penetration holes 311 and 321 are different from each other with respect to the first protection film 310 and the second protection film 320. It is desirable that the average area of the penetration holes 321 of the second protection film 320 be smaller than the average area of the penetration holes 311 of the first protection film 310 in a plan view. That is, in a plan view, an average area of each of the penetration holes 311 and 321 of the protection films 310 and 320 increases with in accordance with the distance of the respective protection film 310 or 320 from the touch screen panel 200.

Also, it is desirable that thicknesses of the first and second protection films 310 and 320 be different from each other. For instance, a thickness of the first protection film 310 may be smaller than a thickness of the second protection film 320.

In a plan view, the average area of the penetration holes 321 of the second protection film 320 is smaller than the average area of the penetration holes 311 of the first protection film 310. A length of each the penetration holes 321 of the second protection film 320 is greater than a length of each the penetration holes 311 of the first protection film 310 when viewed in a longitudinal direction of each penetration holes 321 and 311. Thus, even though molecules in the etchant may pass through the first protection film 310, it may be difficult for the molecules in the etchant to pass through the second protection film 320.

In etching the lower substrate 120 (S4), as illustrated in FIG. 3, a part of the lower substrate 120 is etched using a wet etching process. Accordingly, as illustrated in FIG. 4, a thickness of the lower substrate 120 is reduced from a first thickness h1 to a second thickness h2.

As the wet etching process, a dipping method, a spray method, or a top-down glass etching method may be used. For example, the dipping method is a method of etching the lower substrate 120 by vertically dipping the plurality of display panels 100 in a bath. The spray method is a method of etching the lower substrate 120 by spraying an etchant onto both sides of the display panel 100, which stands vertically at a predetermined spray pressure, using a plurality of spray nozzles. The top-down glass etch method is a method of etching the lower substrate 120 by pouring an etchant onto the display panel 100, which stands vertically, so that the etchant flows down from an upper portion of the display panel 100.

The etchant includes hydrofluoric acid or a material of hydrofluoric acid salt system.

When the etching process is performed, to protect a side surface of the display apparatus that is not protected by the multilayer protection film 300, an additional protection member (not shown) may cover the side surface of the display apparatus.

In removing the multilayer protection film 300 (S5), the multilayer protection film 300 attached to the display panel 100 may be removed from the display panel 100 through a cleaning process.

After the multilayer protection film 300 is removed, a window and a housing for protecting an exposed external surface of the display apparatus may be mounted.

As described above, by performing the etching process while attaching the multilayer protection film 300 onto the touch screen panel 200, the touch screen panel 200 may be protected when the etching process is performed.

Figure 5A:
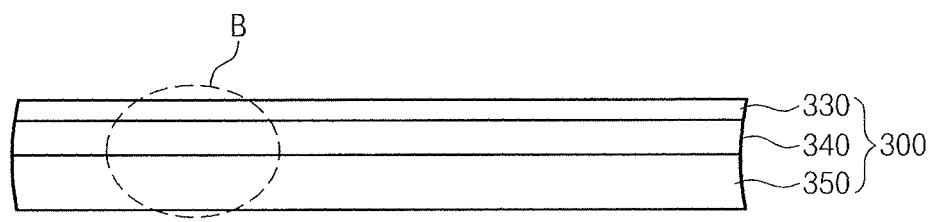
FIG. 5A is a cross sectional view of a multilayer protection film used in a method of manufacturing a display apparatus in accordance with another embodiment.
Figure 5B:
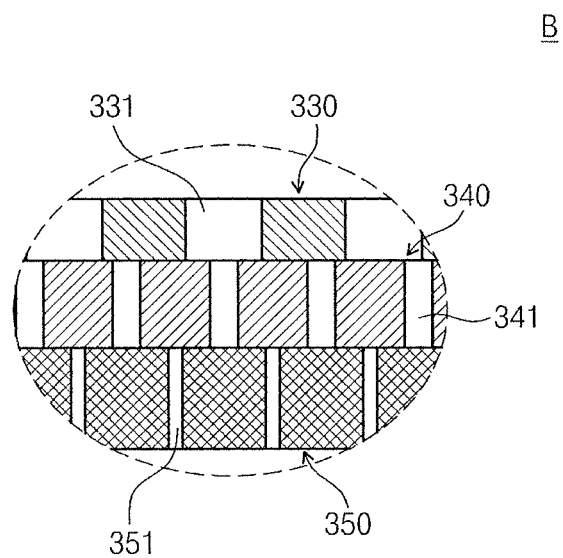
FIG. 5B is an enlarged view of area B illustrated in FIG. 5A.

FIG. 5A is a cross sectional view of a multilayer protection film used in a method of manufacturing a display apparatus in accordance with another embodiment. FIG. 5B is an enlarged view of area B illustrated in FIG. 5A.

Referring to FIGS. 5A and 5B, the multilayer protection film 300 may include a first protection film 330 disposed on the touch screen panel 200 and exposed to the outside when an etching process is performed, a second protection film 340 disposed between the first protection film 330 and the touch screen panel 200, and a third protection 350 disposed between the touch screen panel 200 and the second protection film 340.

Referring to FIGS. 5A and 5B, respective average areas of penetration holes 331, 341 and 351 of the first, second and third protection films 330, 340, and 350 in a plan view are different from one another. It is desirable that the average areas of each the penetration holes 331, 341 and 351 increase with in accordance with the distance of the respective protections film 330, 340, or 350 from the touch screen panel 200 in a plan view. That is, the average area of the penetration holes 331 of the first protection film 330 may be greater than the average area of the penetration holes 341 of the second protection film 340 and the average area of the penetration holes 341 of the second protection film 340 may be greater than the average area of the penetration holes 351 of the third protection film 350.

Respective thickness of the first, second, and third protection films 330, 340, and 350 may decrease in accordance with the distance from the touch screen panel 200. Thus, a length of each of the penetration holes 331 of the first protection film 330 is smaller than a length of each of the penetration holes 341 of the second protection film 340, and the length of each of the penetration holes 341 of the second protection film 340 is smaller than a length of each of the penetration holes 351 of the third protection film 350.

The molecules in the etchant most easily pass through the penetration holes 331 of the first protection film 330 and the molecules in the etchant may pass through the penetration holes 351 of the third protection film 350 with difficulty. Thus, the multilayer protection film 300 may suppress the penetration of the molecules in the etchant.

By way of summation and review, in a method of manufacturing a display device, in order to obtain light weight of the display apparatus and minimization of thickness of the display apparatus, it may be desirable to reduce a thickness of the upper substrate or the lower substrate.

Accordingly, an etching process may be carried out. In the case that the touch screen panel is further added to the display apparatus, a protection film is attached to protect the touch screen panel mounted on the upper substrate. The protection film is removed after performing the etching process.

However, during the etching process, molecules in an etchant may penetrate into the protection film to damage the touch screen panel.

In contrast, as described above, by performing the etching process while the multilayer protection film described herein is attached to the touch screen panel, the upper panel including the touch screen panel may be protected when the etching process is performed to etch the lower substrate.

According to a method of manufacturing a display apparatus, efficiency of an etching process may be improved and the effect of light weight and minimization may be obtained.

The foregoing is illustrative and is not to be construed as limiting thereof. Although a few embodiments have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A method of manufacturing a display apparatus, the method comprising:
    providing a display panel including a first substrate and a second substrate facing each other and a display device disposed between the first substrate and the second substrate;
    providing a touch screen panel attached onto an outer side surface of the first substrate;
    attaching a multilayer protection film including a plurality of protection films having acid resistance onto the touch screen panel;
    etching the second substrate; and
    removing the multilayer protection film,
    wherein the protection films have penetration holes, each of the protection films having a different average area of the penetration holes in a plan view.

2. The method of claim 1, wherein the average area of the penetration holes of respective ones of the protection films in a plan view increases in accordance with a distance of the respective ones of the protection films from the touch screen panel.

3. The method of claim 2, wherein a thickness of respective ones of the protection films decreases in accordance with an increase in the average area of the penetration holes of the protection films.

4. The method of claim 1, wherein the etching process includes a wet etching process using an etchant.

5. The method of claim 4, wherein the average area of penetration holes of each of the protection films is equal to or smaller than a size of molecules in the etchant.

6. The method of claim 1, wherein the multilayer protection film includes:
- a first protection film disposed on the touch screen panel and exposed to the outside when the etching process is performed; and
- a second protection film disposed between the first protection film and the touch screen panel.

7. The method of claim 6, wherein the average area of penetration holes of the first protection film is greater than the average area of penetration holes of the second protection film in the plan view.

8. The method of claim 7, wherein a thickness of the second protection film is greater than a thickness of the first protection film.

9. The method of claim 1, wherein the multilayer protection film includes:
- a first protection film disposed on the touch screen panel and exposed to the outside when the etching process is performed;
- a second protection film disposed between the first protection film and the touch screen panel; and
- a third protection film disposed between the second protection film and the touch screen panel.

10. The method of claim 9, wherein:
- an average area of penetration holes of the first protection film is greater than an average area of penetration holes of the second protection film, and
- the average area of penetration holes of the second protection film is greater than an average area of penetration holes of the third protection film.

11. The method of claim 10, wherein:
- a thickness of the third protection film is greater than a thickness of the second protection film and
- the thickness of the second protection film is greater than a thickness of the first protection film.

12. The method of claim 1, wherein etching the second substrate reduces a thickness of the second substrate.

* * * * *